(12) United States Patent
Chen

(10) Patent No.: US 7,713,852 B2
(45) Date of Patent: May 11, 2010

(54) METHODS FOR FORMING FIELD EFFECT TRANSISTORS AND EPI-SUBSTRATE

(75) Inventor: Pu-Fang Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 240 days.

(21) Appl. No.: 11/761,751

(22) Filed: Jun. 12, 2007

(65) Prior Publication Data

US 2008/0311716 A1 Dec. 18, 2008

(51) Int. Cl.
*H01L 21/04* (2006.01)
(52) U.S. Cl. .................. 438/510; 438/289; 438/455; 257/E21.088; 257/E21.437; 257/E21.567

(58) Field of Classification Search ................ 438/510, 438/289, 455; 257/100, 336, E21.437, E21.088, 257/E21.567
See application file for complete search history.

(56) References Cited

U.S. PATENT DOCUMENTS

| 6,323,519 B1 * | 11/2001 | Gardner et al. ............. 257/336 |
| 6,806,144 B2 | 10/2004 | Chen et al. |
| 2003/0057432 A1 * | 3/2003 | Gardner et al. ............. 257/100 |

* cited by examiner

*Primary Examiner*—Alexander G Ghyka
*Assistant Examiner*—Adbulfattah Mustapha
(74) *Attorney, Agent, or Firm*—Duane Morris LLP

(57) ABSTRACT

A semiconductor method includes thermally treating at least a portion of a substrate so as to generate a plurality of vacancies in a region at a depth substantially near to a surface of the substrate. The substrate is then quenched so as to substantially maintain the vacancies in the region substantially near to the surface of the substrate.

20 Claims, 20 Drawing Sheets

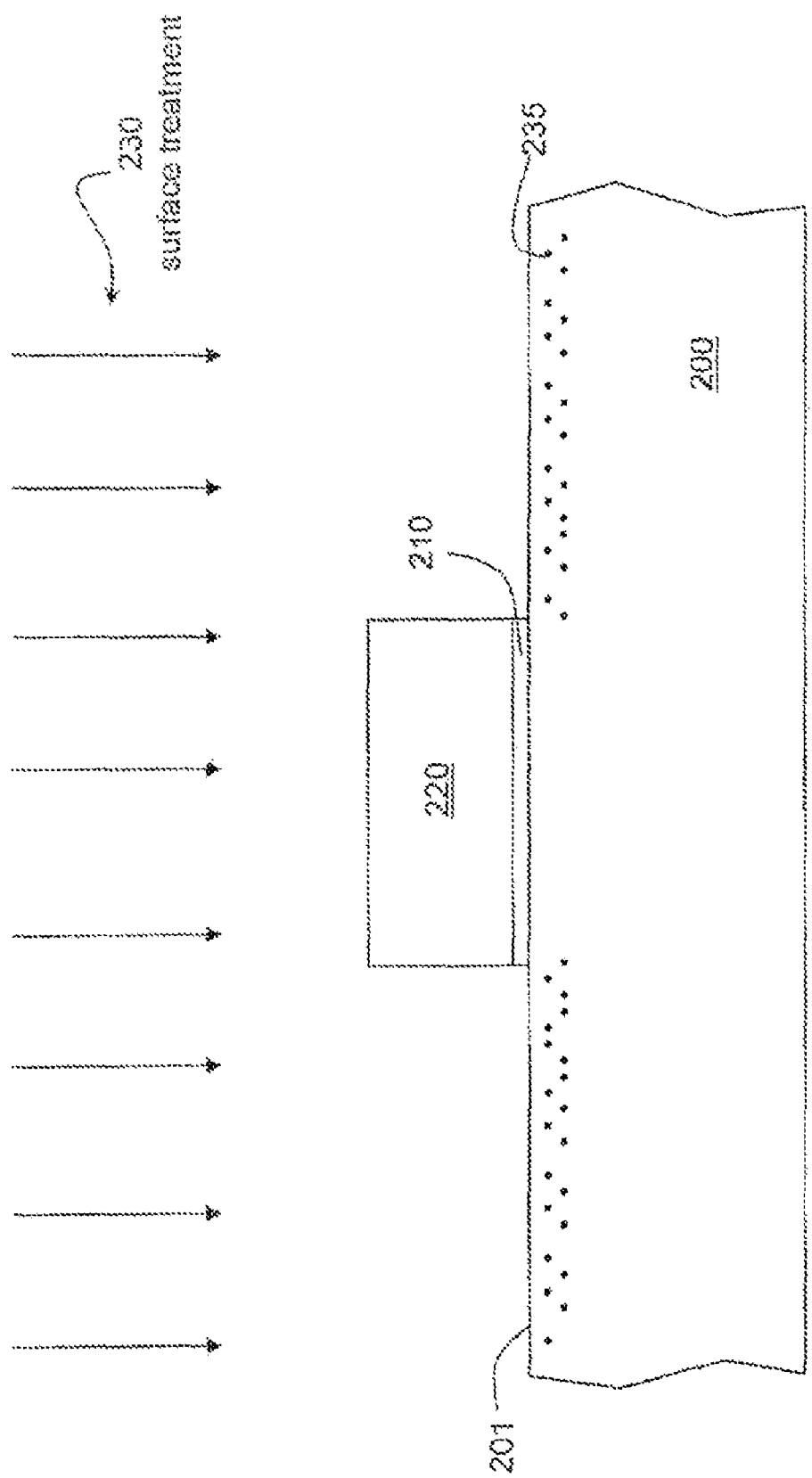

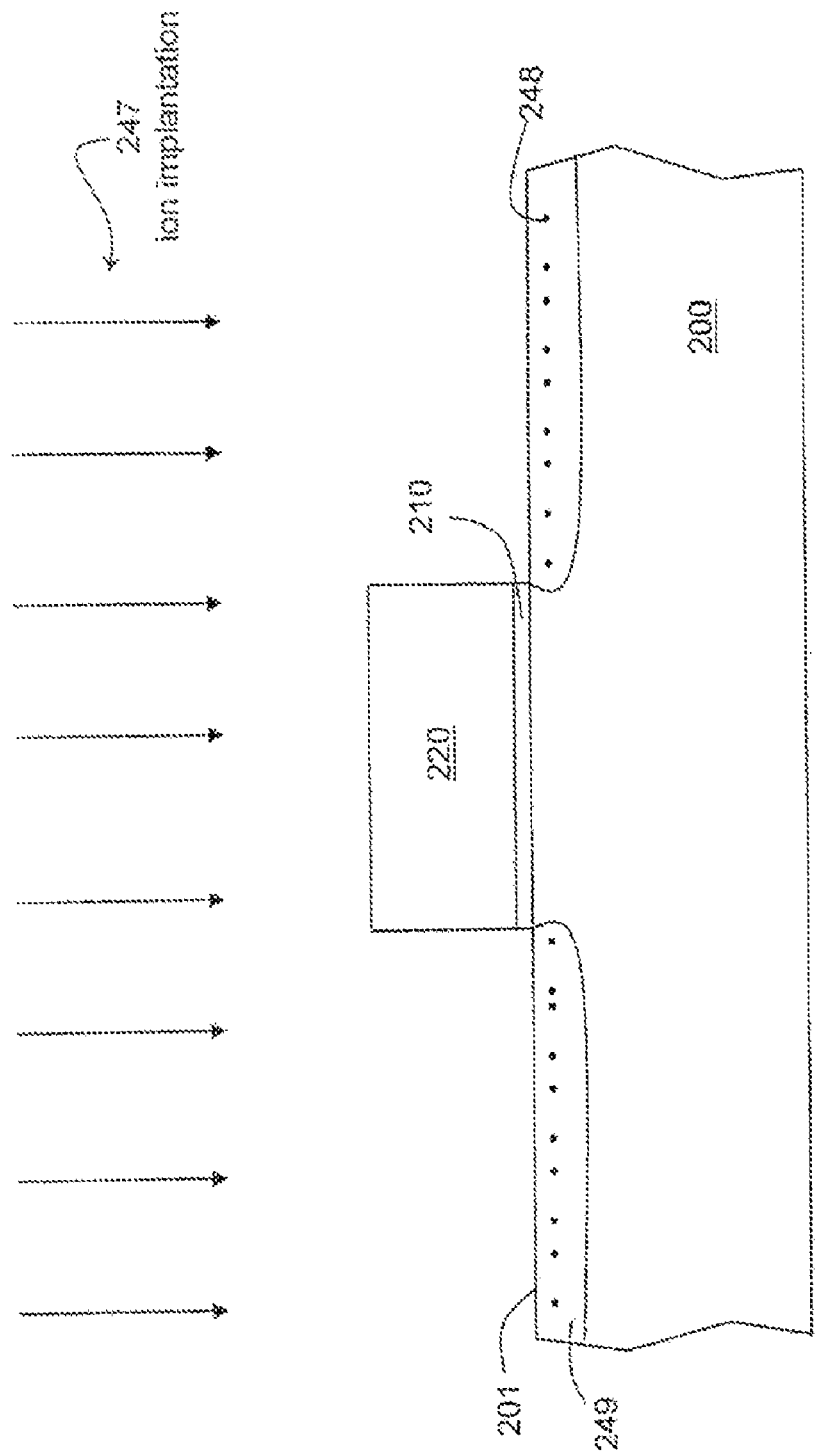

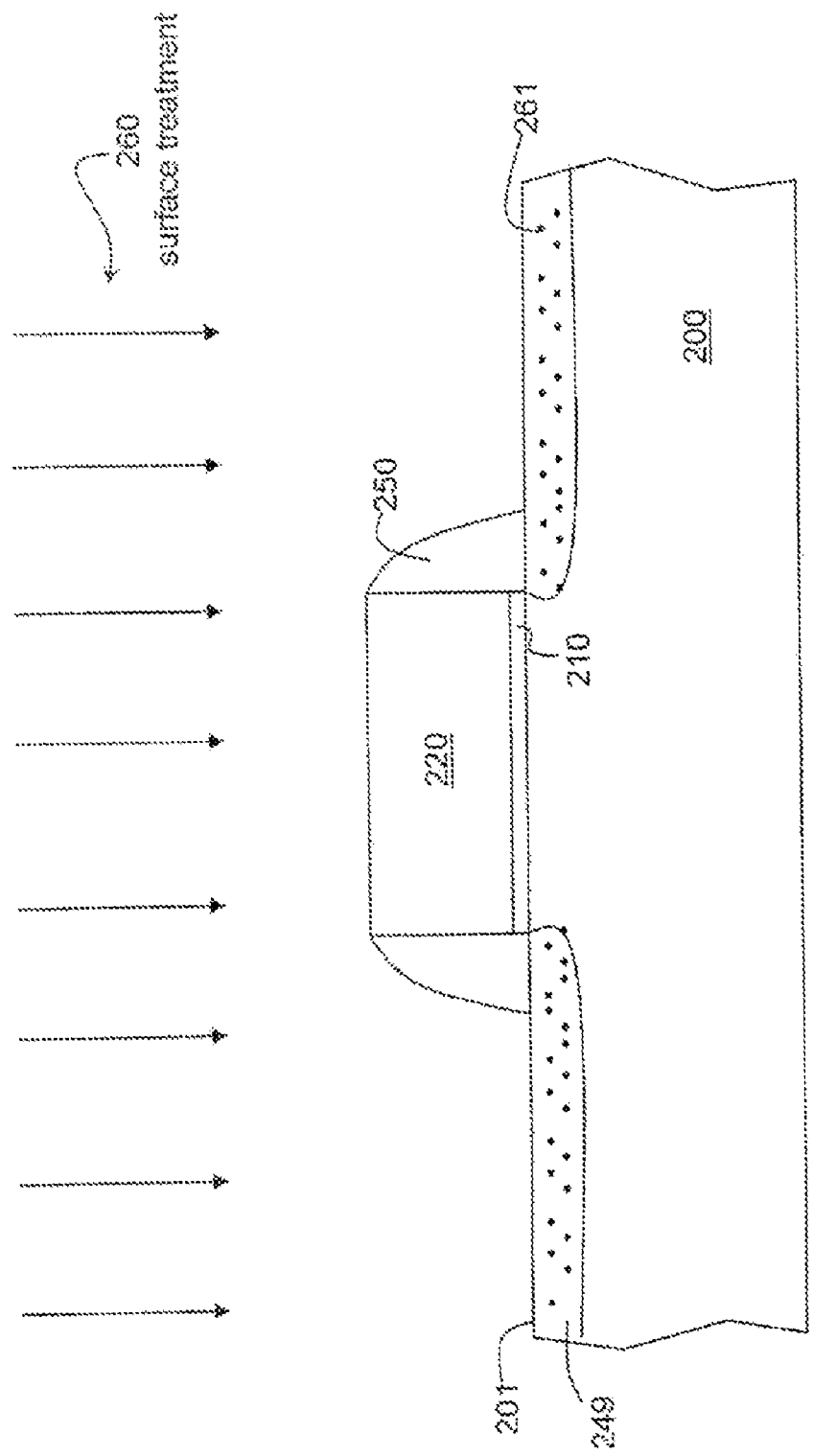

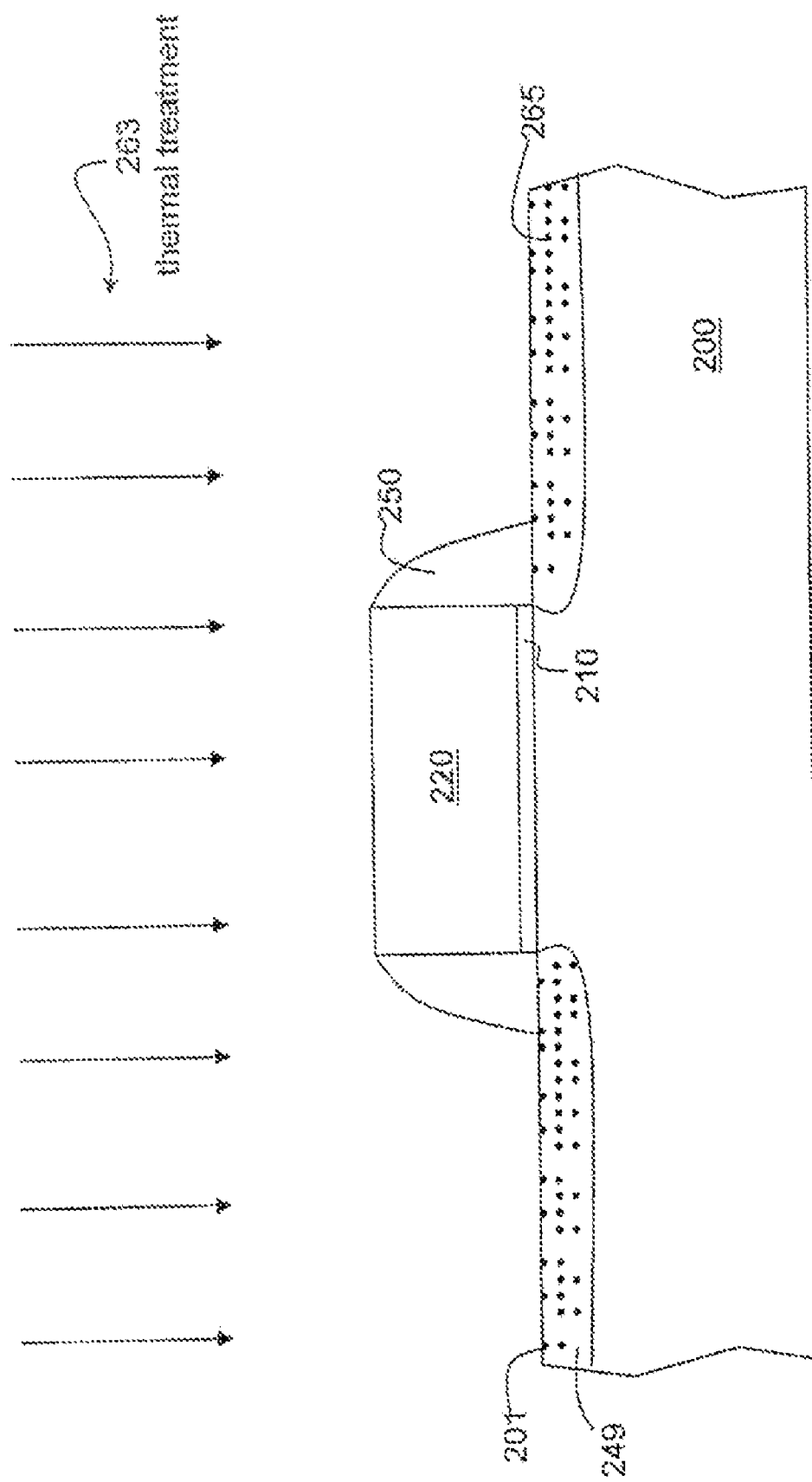

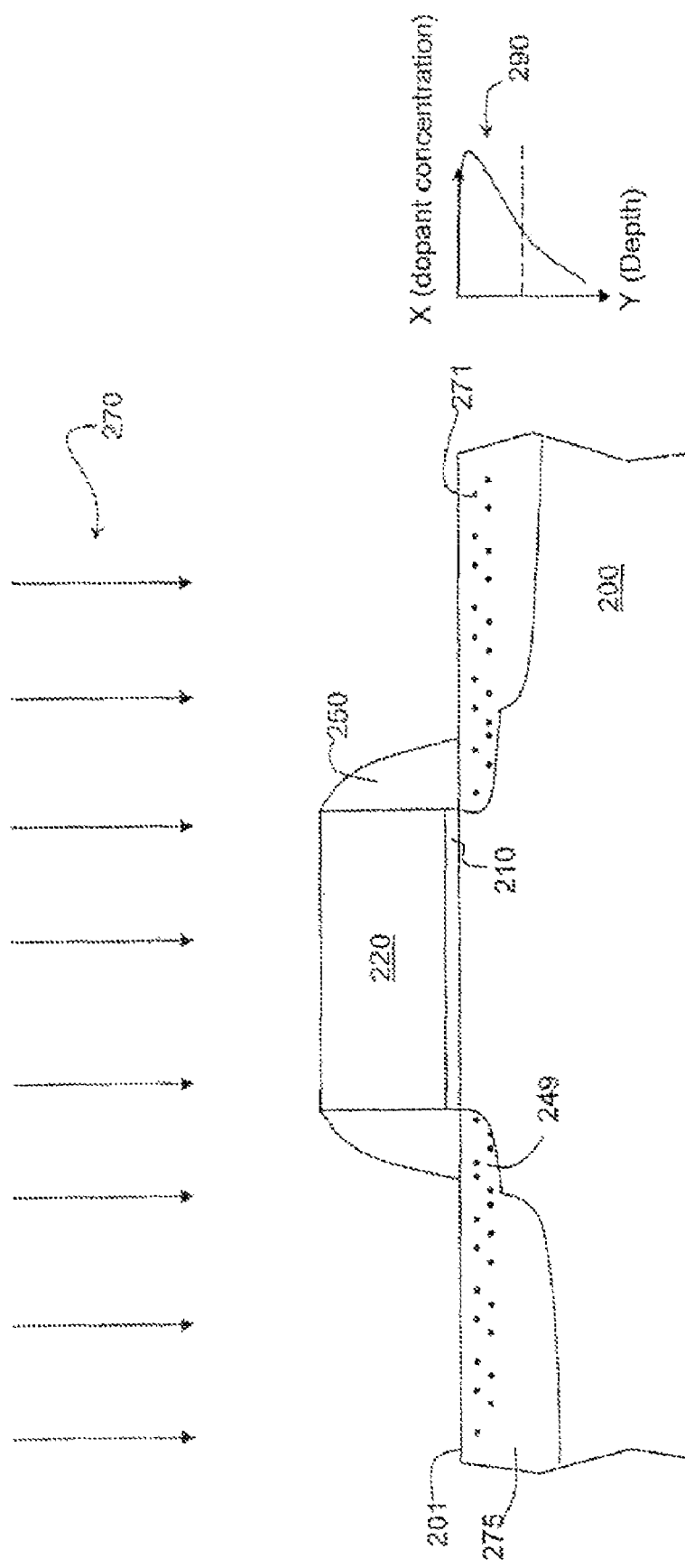

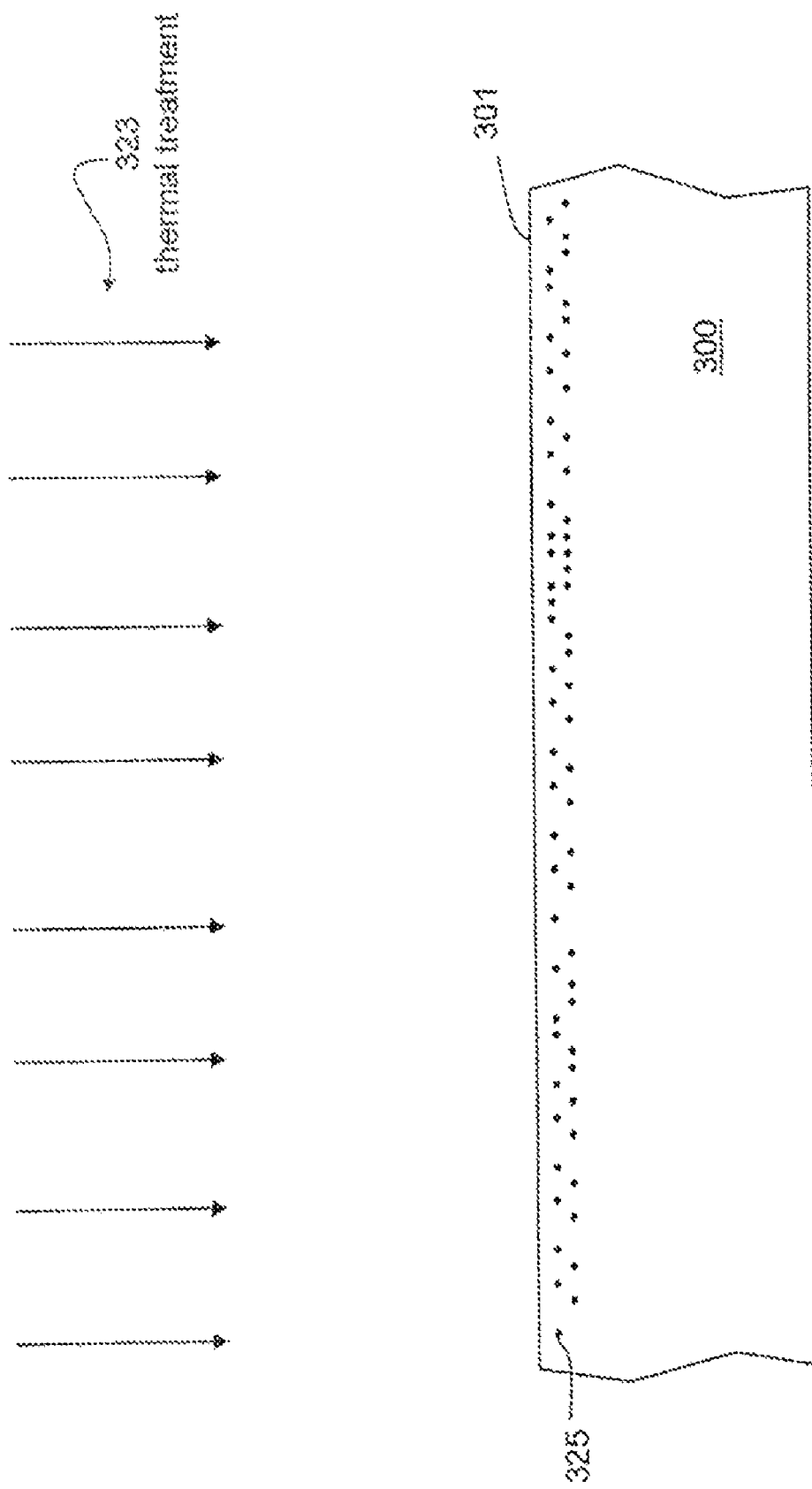

METHODS FOR FORMING FIELD EFFECT TRANSISTORS AND EPI-SUBSTRATE

BACKGROUND OF THE INVENTION

1. Field of the Invention

The present invention relates generally to methods for forming semiconductor structures, and more particularly to methods for forming field effect transistors (FETs) and epi-substrates.

2. Description of the Related Art

With advances in electronic products, semiconductor technology has been applied widely in manufacturing memories, central processing units (CPUs), liquid crystal displays (LCDs), light emitting diodes (LEDs), laser diodes and other devices or chip sets, in order to achieve high-integration and high-speed requirements, dimensions of semiconductor integrated circuits have been reduced and various materials, such as copper and ultra low-k dielectrics, have been proposed and are being used along with techniques for overcoming manufacturing obstacles associated with these materials and requirements. In order to achieve high-speed performance, dimensions of transistors have been shrinking. Salicidation technology has been widely applied in manufacturing transistors in order to reduce resistances of transistor gates and source/drain (S/D) contacts.

FIG. 1 is a schematic cross-sectional view showing a traditional field effect transistor (FET).

Referring to FIG. 1A, a gate oxide layer 110 and a polysilicon gate 120 are sequentially formed over a substrate 100. Spacers 130 are formed on sidewalls of the gate oxide layer 110 and die polysilicon gate 120. Lightly doped drain (LDD) regions 150 and source/drain (S/D) regions 160 are formed within the substrate 100 and adjacent to the gate oxide layer 110. Salicide layers 140 are formed on the polysilicon gate 120 and the S/D regions 160. Due to the salicide layers 140, which include metallic constituents, resistances of the polysilicon gate 120 and the S/D regions 160 are desirably achieved.

As the channel dimension of transistors is reduced, the thickness of the gate oxide layer 110 is also reduced. The thin gate oxide layer 110, however, is vulnerable to a voltage applied to the polysilicon gate 120 and may be damaged by the voltage. In order to mitigate the breakthrough effect of the gate oxide layer 110, a high dielectric constant material layer such as nitride or oxynitride is used such that the thickness of the gate dielectric layer 110 can be increased to sustain the voltage applied the polysilicon gate 120.

Based on the foregoing, improved methods for forming FET structures are desired.

SUMMARY OF THE INVENTION

In accordance with some exemplary embodiments, a semiconductor method includes thermally treating at least a portion of a substrate so as to generate a plurality of vacancies in a region substantially near to a surface of the substrate. The substrate is then quenched so as to substantially maintain the vacancies in the region substantially near to the surface of the substrate.

The above and other features will be better understood from the following detailed description of the preferred embodiments of the invention that is provided in connection, with the accompanying drawings.

BRIEF DESCRIPTION OF THE DRAWINGS

Following are brief descriptions of exemplary drawings. They are mere exemplary embodiments and the scope of the present invention should not be limited thereto.

FIGS. 2A-2K axe schematic cross-sectional views showing an exemplary method for forming a transistor.

FIG. 2M is a schematic drawing showing a dopant profile of an exemplary semiconductor structure of FIG. 2J.

FIGS. 3A-3G are schematic cross-sectional views showing an exemplary method for forming an epi-substrate.

DETAILED DESCRIPTION OF EXEMPLARY EMBODIMENTS

Figure 1B:
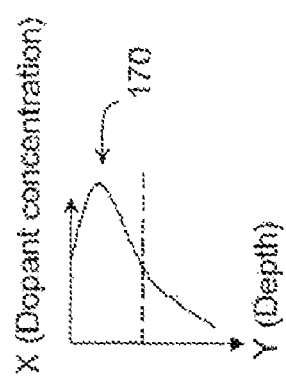
FIG. 1B is a drawing showing a dopant profile of the LDD region and S/D region of the FET shown in FIG. 1A.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus/device be constructed or operated in a particular orientation.

FIGS. 2A-2K are schematic cross-sectional views showing an exemplary method for forming a transistor.

Figure 2A:
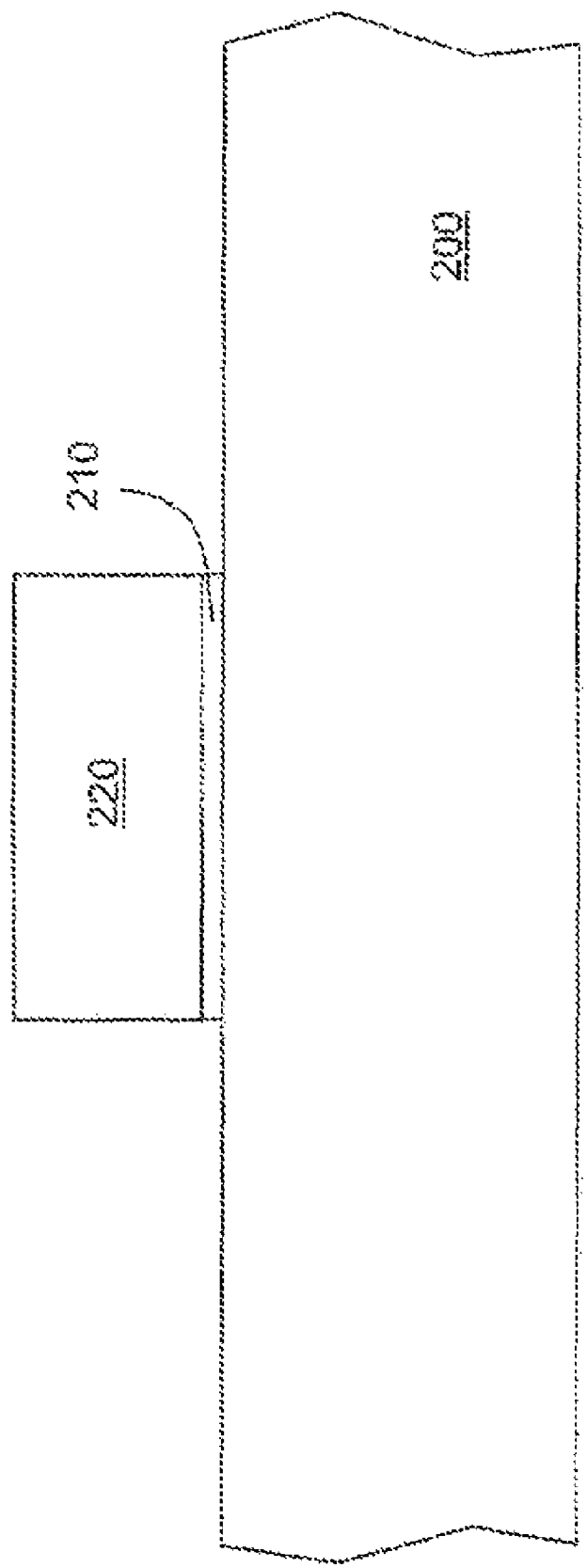

Referring to FIG. 2A, a dielectric layer 210 and a gate 220 are formed over a substrate 200.

The substrate 200 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, for example.

In some embodiments, the dielectric layer 210 may be generally referred to as a gate dielectric layer upon which the gate 220 is formed. The dielectric layer 210 may be, for example, a silicon oxide layer, a silicon nitride layer, a silicon oxynitride layer, a high-k dielectric layer containing a material such as $HfO_2$, $HfSiO_4$, $ZrO_2$, $ZrSiO_4$, $Ta_2O_3$, HfSiON or the like, a multiple-layer structure or various combinations thereof. In some embodiments, the dielectric layer 210 may be formed by, for example, a thermal oxidation process, a chemical vapor deposition (CVD) process, an epitaxy process, other suitable processes, or various combinations thereof.

Referring again to FIG. 2A, the gate 220 is formed over the dielectric layer 210. The gate 220 may comprise, for example, a silicon layer, a polysilicon layer, an amorphous silicon layer, a SiGe layer, a conductive material layer, a metallic layer, other suitable layers, or various combinations thereof. The gate 220 may be formed by, for example, a CVD process but other suitable formation processes may alternatively be used.

Referring to FIG. 2B, a surface treatment 230 may be applied to the exposed surface 201 of the substrate 200 so as to generate a plurality of nitrogen components and/or vacancies 235 in a region near to the surface 201 of the substrate 200. The surface treatment 230 may comprise, for example, a plasma treatment, an ion implantation process (such as a low-energy ion implantation process) or other methods that is adequate to generate vacancies 235 near to the surface 201 of the substrate 200, or combinations thereof. In some embodiments, the surface treatment 230 may have a plasma power between about 100 W and about 2,000 W. In some embodiments, the surface treatment 230 is a plasma treatment and may have a processing temperature between about 20° C. and about 40° C. In other embodiments, the surface treatment 230 is an ion implantation and may have an implantation energy between about 0.2 KeV and about 10 KeV. In some embodiments, the surface treatment 230 may have an implant dosage between about 1E14 and about 8E15. In some embodiments, the peak of the nitrogen profile may be present between, about 10 Å and about 400 Å from the surface 201 of the substrate 200.

In some embodiments, the surface treatment 230 may be a nitrogen-containing plasma treatment. The plasma treatment may use a precursor comprising at least one of nitrogen ($N_2$), nitrous oxide ($N_2O$), nitric oxide (NO), nitrogen oxide ($NO_2$), ammonia ($NH_3$) or other nitrogen containing gas or various combinations thereof, in other embodiments, the surface treatment 230 may be a low-energy ion implantation process using a nitrogen-containing gas, e.g., $N_2$, $N_2O$, NO, $NO_2$, $NH_3$ or other nitrogen containing gas or various combinations thereof, as a precursor for generating the implantation ions.

In some embodiments, an unpatterned dielectric layer (not shown and provided to form the dielectric layer 210) is formed, over the substrate 200. The unpatterned dielectric layer (not shown) may have a thickness which approximates that of the dielectric layer 220. The surface treatment 230 may be applied through the unpatterned dielectric layer (not shown), so as to form a profile of the nitrogen components and vacancies 235 with a peak at a depth near to the interface of tire dielectric layer (not shown) and the substrate 200. A material layer (not shown and provided to form the gate 220) is formed over the unpatterned dielectric layer. The material layer and the unpatterned dielectric layer are then subjected to a photolithographic process (not shown) and an etch process (not shown) so as to define the dielectric layer 210 and the gate 220. The etch process (not shown) may at least partially remove the unpatterned dielectric layer (not shown) at the region not covered by the gate 220. In some embodiments, the formation of the unpatterned dielectric layer (not shown) and the surface treatment 230 may be performed by, for example, a decoupled plasma nitridation (DPN) process.

Figure 2C:
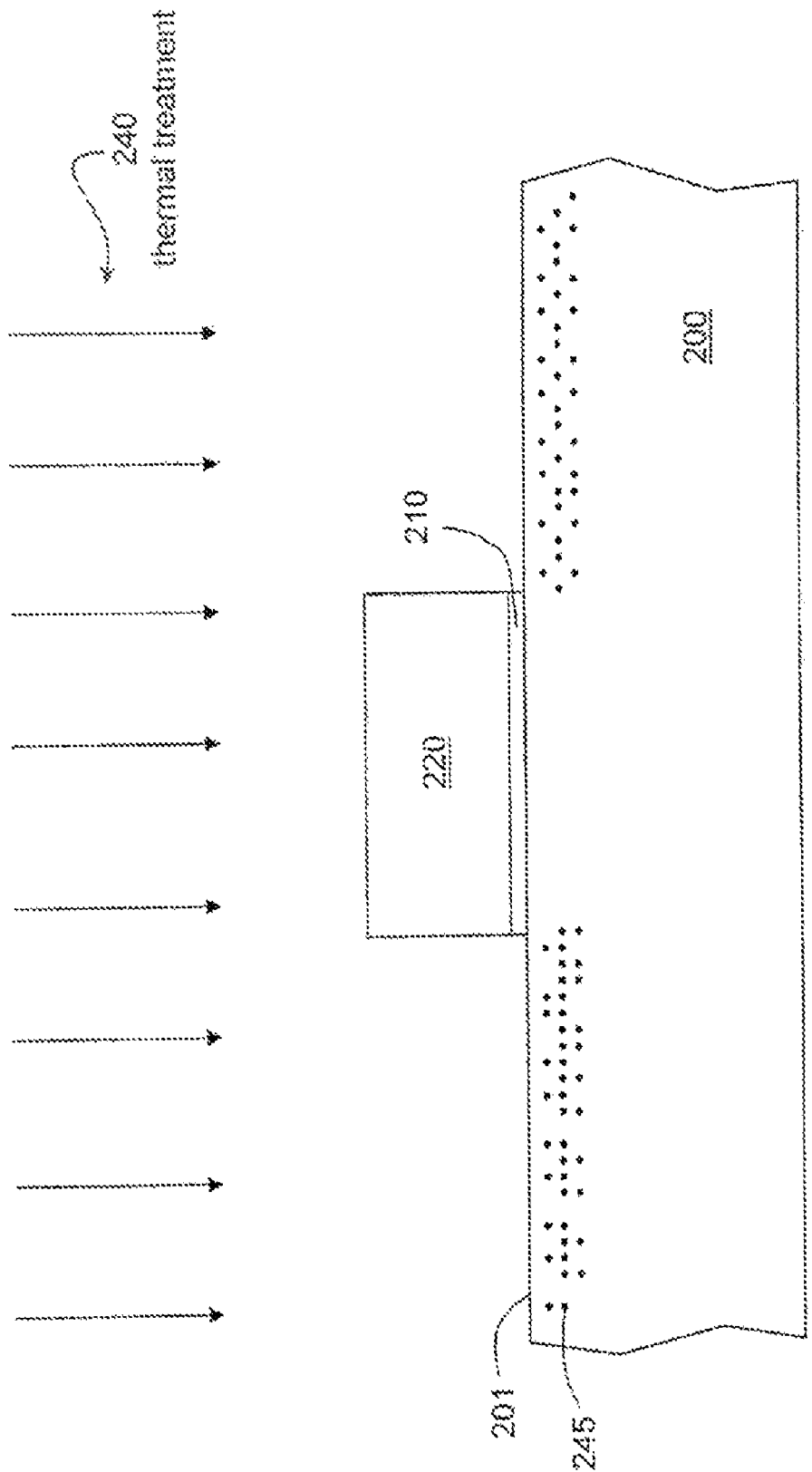

Referring to FIG. 2C, a thermal treatment 240 is applied to the surface 201 of the substrate 200. In souse embodiments, the thermal treatment 240 may comprise, for example, a rapid thermal treatment with a processing temperature between about 1,000° C. and about 1,250° C. In some embodiments, the thermal, treatment 240 is conducted, in a nitrogen-containing ambient comprising $N_2$, $N_2O$, NO, $NO_2$, $NH_3$ or other nitrogen containing gas or various combinations thereof. It is found that the nitrogen components provided by the surface treatment 230 and/or the thermal treatment 240 may enhance generation of vacancies 245 in the region near to the surface 201 of the substrate 200 under the thermal treatment 240.

Further, it is also found that the vacancy distribution profile is related to die process temperature of the thermal treatment 240. Referring to FIG. 2L, the vertical axis represents the thickness of a blank substrate and the horizontal axis represents the vacancies. In FIG. 2L, curves a, b and c represents thermal treatments with process temperatures at about 1,150° C., 2,250° C. and 1,350° C., respectively. The vertical axis ranges from 0 micron (μm) 800 μm. "0 μm" and "800 μm" represent two opposite surfaces of the blank substrate. Referring again to FIG. 2L, the thermal treatment at about 1,350° C. generates more vacancies than the thermal treatment at about 1,150° C. or 1,250° C. at surfaces of the blank substrate as well as the bulk of the blank substrate. Therefore, the surface treatment 230 and/or the thermal treatment 240 may desirably generate vacancies at the region near to the surface 201 of the substrate 200.

Figure 2D:
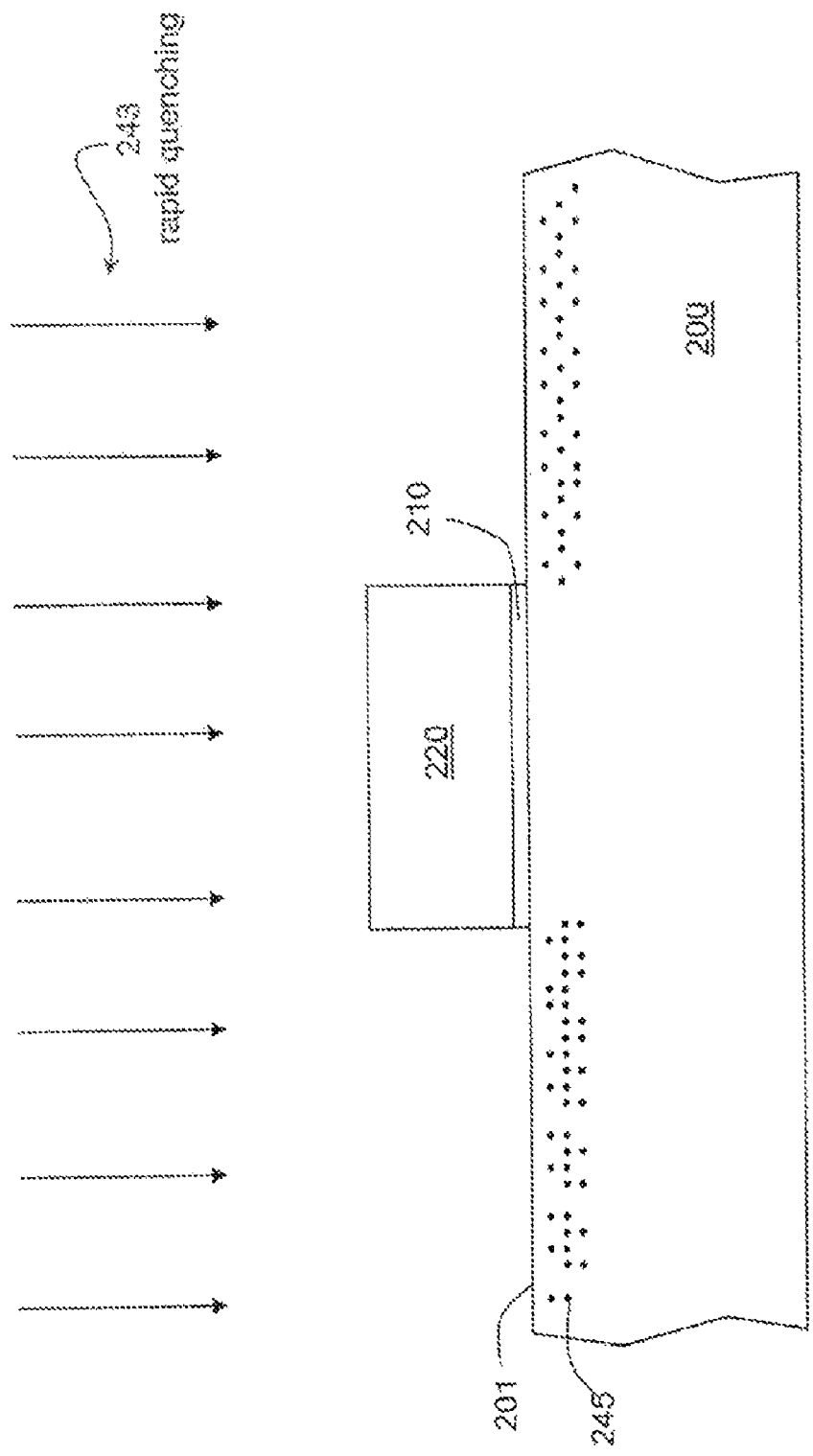

Referring to FIG. 2D, a rapid quenching process 243 is applied to the surface 201 of the substrate 200 such that the distribution profile of the vacancies 245 may be substantially maintained as that after the thermal treatment 240. Therefore, the peak of the distribution profile of the vacancies 245 may be desirably maintained at the region near to the surface 201 of the substrate 200. In some embodiments, the peak of the vacancy profile may be present between about 100 Å and about 800 Å from the surface 201 of the substrate 200. In some embodiments, the rapid quenching process 243 is a rapid thermal anneal (ETA) process having a quenching rate between about 50° C. per second (° C./sec) and about 100° C./sec. In other embodiments, the rapid quenching process 243 is a FLASH anneal process having a quenching rate between about 100° C./sec and about 300° C./sec. The vacancies 245 are generated to accommodate dopants such as boron, phosphorus, arsenic, or the like or combinations thereof provided by an ion implantation process such as ion implantation processes 247 and/or 270 shown in FIGS. 2E and 2L respectively.

Referring to FIG. 2E, an ion implantation process 247 is applied to the surface 201 of the substrate 200, in some embodiments, the ion implantation process 247 may be generally referred to as a lightly doped drain (LDD) implantation. The LDD implantation process 247 may implant dopants (not shown) such as boron, phosphorus, arsenic, or the like or combinations thereof into the substrate 200 adjacent to the dielectric layer 210 so as to form LDD regions 249.

The dopants provided by the ion implantation process 247 may fill in the vacancies 245 (shown in FIG. 2D). As described above in FIGS. 2B and 2C, the surface treatment 230 and the thermal treatment 240 may desirably generate a number of the vacancies 245 (shown in FIG. 2D). Due to the vacancies 245, more dopants may desirably fit in the vacancies 245 and bond with silicon components within the substrate 200. Accordingly, the peak of the dopant profile of the LDD regions 249 may be desirably formed in the region near to the surface 201 of the substrate 200, and the resistances of the LDD regions 249 can be desirably achieved. Moreover, the shallow dopant profile of the LDD regions 249 may desirably keep the formation of salicide layers 285 (shown in FIG. 2K) at the region near to the top surface 201 of the substrate 200 such that the thickness of the salicide layer 285 can be desirably controlled.

In some embodiments, another thermal treatment (not shown) such as a furnace annealing process or a rapid thermal process (RTP) may be applied to the LDD-implanted regions 249 such that the dopants (not shown) described in FIG. 2E may desirably bond with silicon components of the substrate 200 and/or heal damage or dislocations resulting from processes such as the surface treatment 220 and/or the ion implantation process 247. After the ion implantation process 247 and/or the thermal treatment (not shown), the dopants (not shown) are bonded with the vacancies 245 (shown in FIG. 2D) and the number of the vacancies 248 may be less than that of vacancies 245 shown in FIG. 2D.

In some embodiments, the processes 230, 240 and 243 may be omitted if the processes 260, 263 and 267 (shown in FIGS. 2G-2I) may achieve a desired dopant profile and resistance of the LDD regions 249. In some embodiments, the thermal treatment (not shown) provided to bond dopants (provided by the process 247) with silicon components of the substrate 200 and/or heal damage or dislocations may be omitted if the thermal treatment (not shown) conducted after the ion implantation, process 270 may desirably achieve the same purposes. Accordingly, one of ordinary skill in the art is able to modify the process for forming a desirable FET.

Figure 2F:
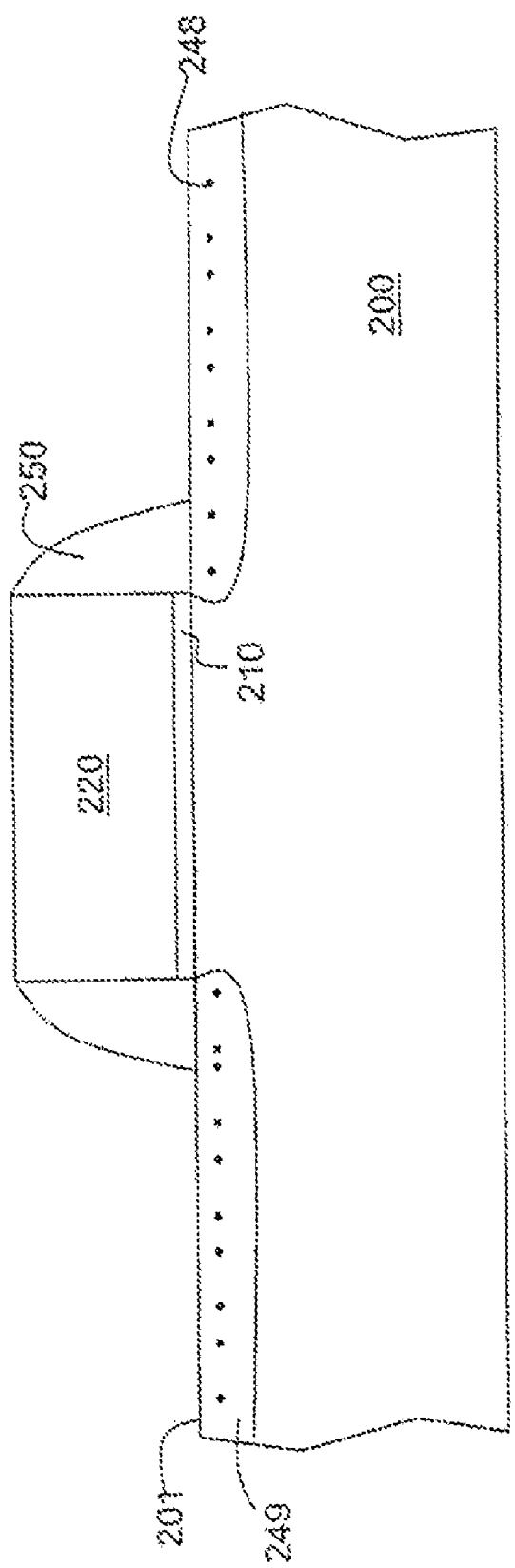
Figure 21:
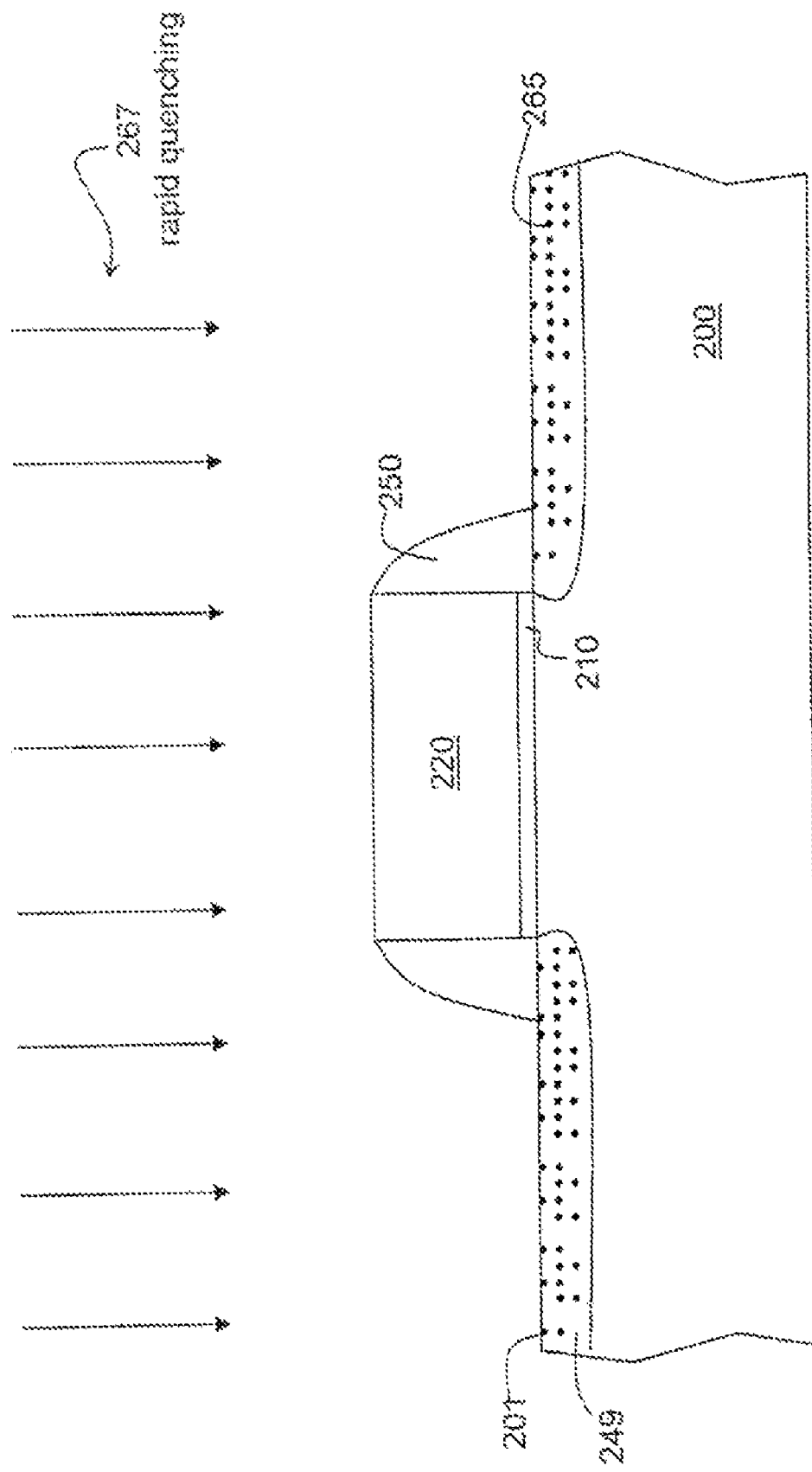

Referring to FIG. 2F, spacers 250 are formed on the sidewalls (not labeled) of the gate 220 and the dielectric layer 210. The material of the spacers 250 may comprise, for example, oxide, nitride, oxynitride, other dielectric material, or the like or combinations thereof.

In some embodiments, the process for forming the spacers 250 may comprise, for example, forming a dielectric layer (not shown) that may be substantially conformal over the structure show in FIG. 2E. An etch process such as an etchback process (not shown) is then performed to remove a portion of the dielectric layer so as to form the spacers 250. In some embodiments, multiple spacers (not shown) may be formed on the sidewalls of the gate 220 and the dielectric layer 210 and the formation of the multiple spacers (not shown) may be achieved by repeating the process described in FIG. 2F.

Referring to FIG. 2G, a surface treatment 260 is applied to the surface 201 of the substrate 200 so as to generate a plurality of nitrogen components and/or vacancies 261 in die region near to the surface 201 of the substrate 200. In some embodiments, the surface treatment 260 may be similar to the surface treatment 230 described above in connection with FIG. 2B. Since the surface treatment 260 may generate more vacancies and nitrogen components, the vacancies 261 may outnumber the vacancies 248 shown in FIG. 2F.

Referring to FIG. 2H, a thermal treatment 263 is applied to the surface 201 of the substrate 200 so as to generate a plurality of vacancies 265 in the region at a depth near to the surface 201 of the substrate 200. The thermal treatment 263 may be conducted in a nitrogen-containing ambient. In some embodiments, the thermal treatment 263 may be similar to the thermal treatment 240 shown in FIG. 2C. As described above with reference to FIG. 2C, nitrogen components may aid the generation of vacancies in the region near to the surface 201 of the substrate 200 under die thermal treatment 263. Accordingly, the thermal treatment 263 may generate more vacancies in the region, near to the surface 201 of the substrate 200, so that the number of the vacancies 265 may be larger than that of the vacancies 261 (shown in FIG. 2G).

Referring to FIG. 2I, a rapid, quenching process 267 is applied to the surface 201 of the substrate 200, such that the distribution profile of the vacancies 265 may be substantially maintained as that after the thermal treatment 263. Therefore, the peak of the distribution profile of the vacancies 265 may be desirably maintained at the depth of the region near to the surface 201 of the substrate 200. In some embodiments, the rapid quenching process 267 may be similar to the rapid quenching process 243 shown in FIG. 2D.

Referring to FIG. 2J, an ion implantation process 270 is applied to Implant one or more dopants (not shown) such as boron, phosphorus, arsenic, or the like or combinations thereof within the substrate 200 adjacent to the spacers 250. In some embodiments, the ion implantation process 270 may be referred to as a source/drain (S/D) implantation process so as to form the S/D regions 275.

The dopants (not shown) provided by the ion implantation process 270 may fill in the vacancies 265 (shown in FIG. 2I). As described above in FIGS. 2G and 2H, the surface treatment 260 and the thermal treatment 263 may desirably generate a number of the vacancies 265 (shown in FIG. 2I). Due to the vacancies 265, more dopants may desirably fit in the vacancies 265 and bond with silicon components within the substrate 200. Accordingly, the peak of the dopant profile of the S/D regions 275 may be desirably formed at a depth of the region near to the surface 201 of the substrate 200 and the resistances of the S/D regions 275 can be desirably achieved. Moreover, the shallow dopant profile of the S/D regions 275 may desirably keep the formation of salicide layers 285 (shown in FIG. 2K) at the depth of the region near to the top surface 201 of the substrate 200 such that, the thickness of the salicide layer 285 can be desirably achieved.

In some embodiments, another thermal treatment (not shown) such as a furnace annealing process or a rapid thermal process (RTF) may be applied to the S/D-implanted regions 275, such that the dopants (not shown) described in FIG. 2J may desirably bond with silicon components of the substrate 200 and/or heal damage or dislocations resulting from processes such as the surface treatment 260 and/or the ion implantation process 270. After the ion implantation process 270 and/or the thermal treatment (not shown), the dopants (not shown) are filled within the vacancies 265 (shown in FIG. 2I) and the number of the vacancies 271 may be less than that of vacancies 265 shown in FIG. 2D.

Figure 2K:
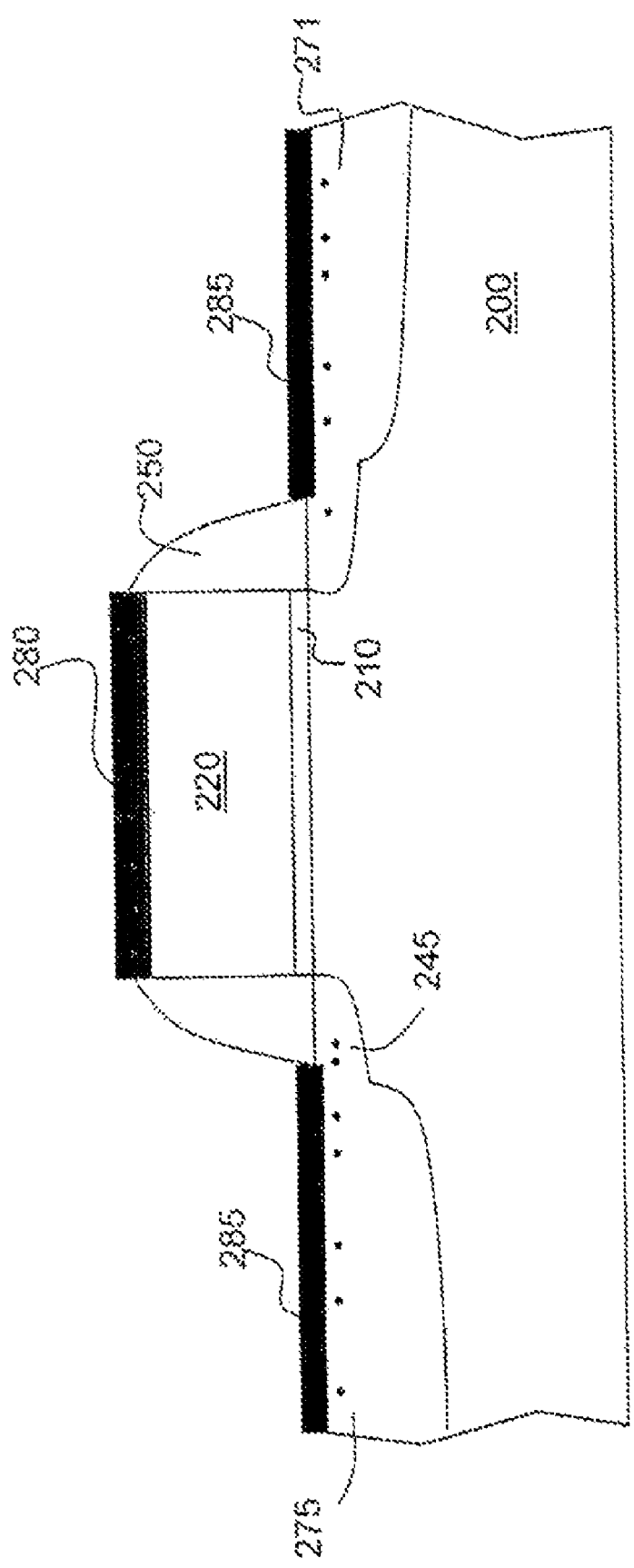
Figure 2L:
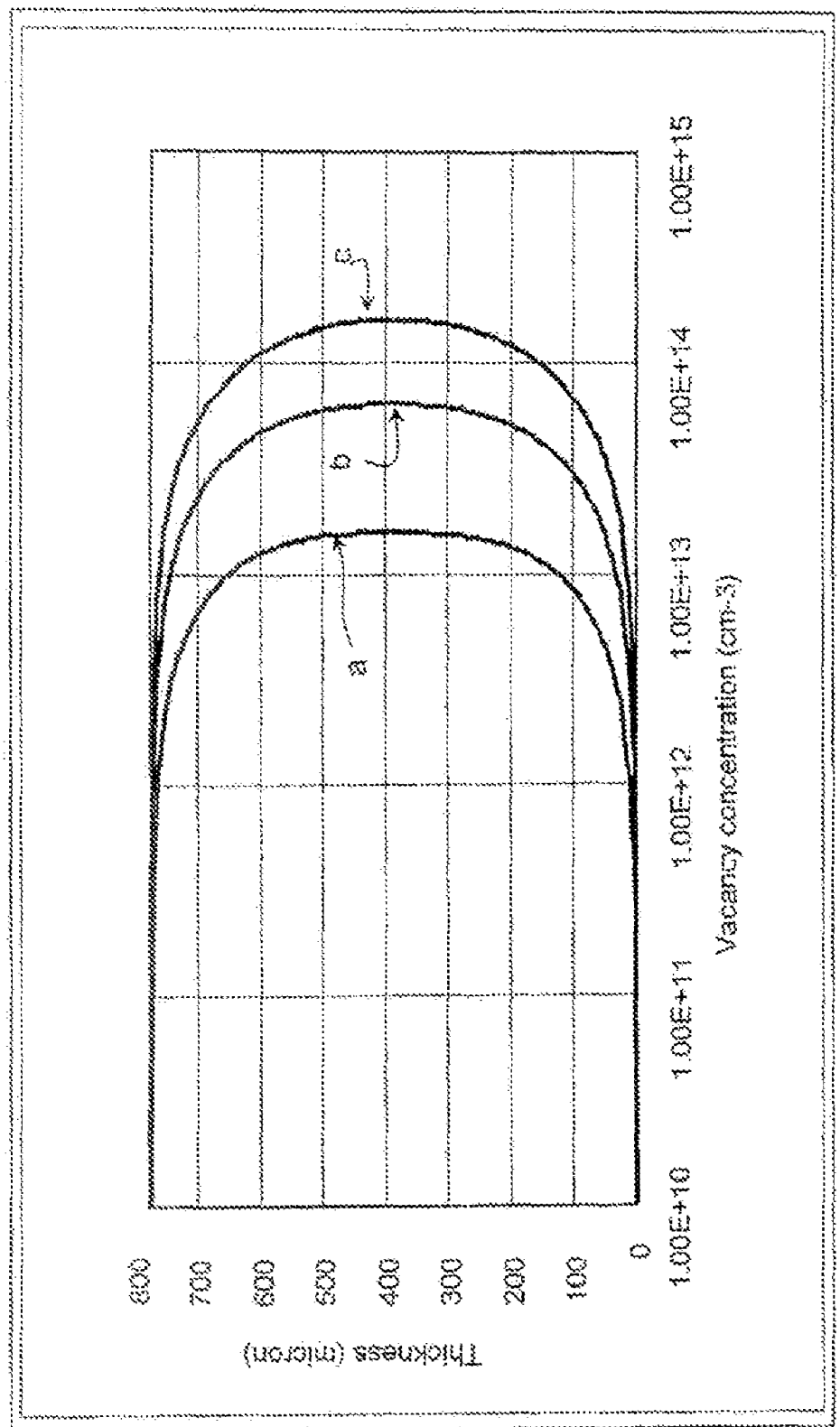
FIG. 2L is a drawing showing relationships between vacancy concentrations and process temperatures of thermal treatments.

Referring to FIG. 2K, salicide layers 280 and 285 are formed on the gate 220 and the S/D regions 275, respectively. In some embodiments, the salicide layers 280, 285 may comprise, for example, tungsten salicide, cobalt salicide, titanium salicide, tantalum salicide, nickel salicide, or other metallic salicide or combinations thereof.

The process for forming the salicide layers 280, 285 may comprise, for example, forming a metallic layer (not shown) such as cobalt, nickel, titanium, tantalum, or other metallic layer or combinations thereof over the substrate shown in FIG. 2J. A thermal process such as an annealing process is conducted such that the components of the metallic layer interact with dopants and/or silicon components within the S/D regions 275 and gate 220. The metallic layer (not shown), however, does not substantially interact with the dielectric spacers 250. The non-reacted metallic layer is then removed by, for example, a dry etch process, a wet etch process or other metal removing process.

Figure 1A:
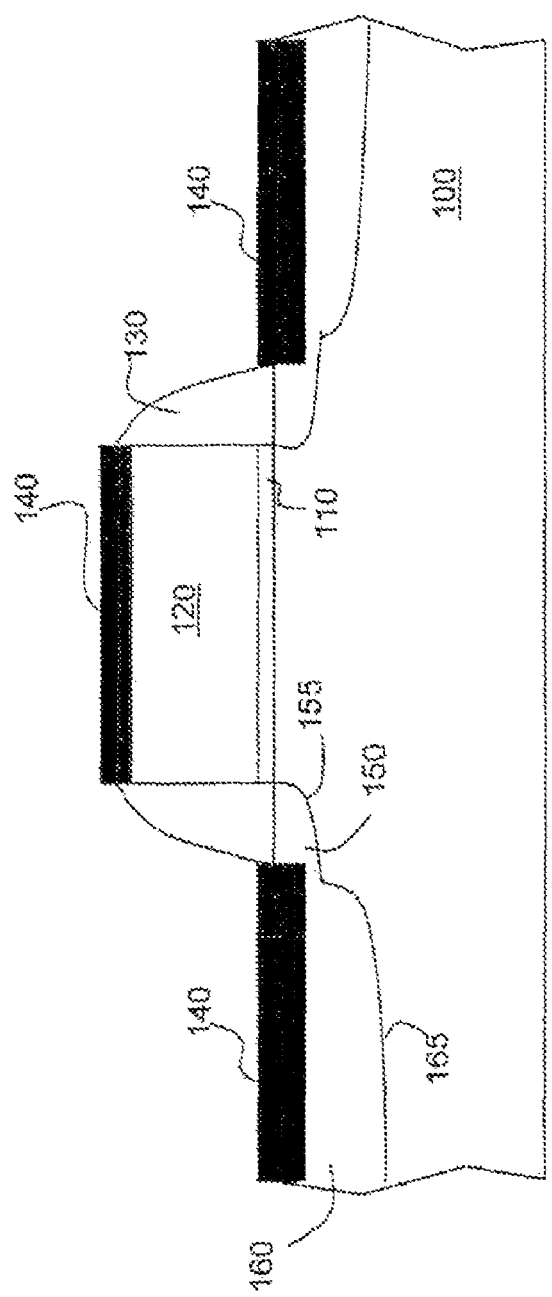
FIG. 1A is a schematic cross-sectional view showing a traditional field effect transistor (FET).

It is found out that the dopant profiles of the LDD regions 150 and S/D regions 160 (shown in FIG. 1A) are not near to the surface (not labeled) of the substrate 100 as shown in FIG. 1B. Accordingly, the salicide layers 140 formed from the interaction of the metallic layer (not shown) and silicon components of the substrate 100 may extend toward the depth where the peak of the dopant profile 170 (shown in FIG. 1B) of the LDD regions 150 and S/D regions 160 exist. The extension of the formation of the salicide layer 140 may result in thick salicide layers which are near to the boundaries 155, 165 of the substrate 100 and the LDD regions 150 and S/D regions 160, respectively. When the dimensions of the FET configuration (shown in FIG. 1A) are reduced, the deep salicide layers 140 within the LDD regions 150 and S/D regions 160 may result in the current leakage between the S/D regions 160 and the substrate 100 and/or the short channel effect between the S/D regions 160.

As described above in connection with FIG. 2J, the vacancies 265 generated by the processes 230, 240, 243, 260, 263 and/or 267 may be maintained at within a volume near to the surface 201 of the substrate 200. After the ion implantation process 270, the peak of the dopant profile 290 (shown in FIG. 2M) may be desirably formed at the depth near to the surface 201 of the substrate 200 in the S/D regions 275. After the metallic layer (provided to form the salicide layers 285) is formed to interact with silicon components of the substrate 200, the salicide layers 285 can be desirably formed in the region near to the top surface 201 of the substrate 200. Accordingly, desirably thin salicide layers 285 may be formed.

FIGS. 3A-3G are schematic cross-sectional views showing an exemplary method for forming an epi-substrate.

Figure 3A:
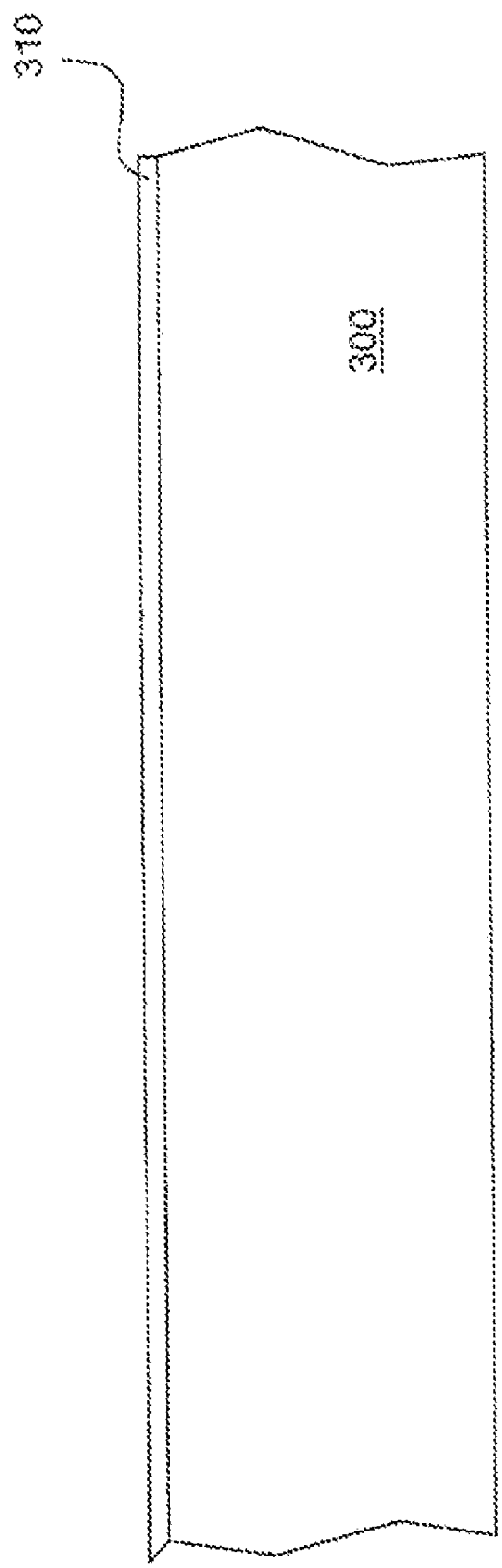

Referring to FIG. 3A, a dielectric layer 310 is formed over a substrate 300. In some embodiments, the substrate 300 may be similar to the substrate 200 set forth above in connection with FIG. 2A. The dielectric layer 310 may comprise a material such as oxide, nitride, oxynitride, or other dielectric layer or the combination thereof. In some embodiments, the dielectric layer 310 may be formed by, for example, a CVD process.

Figure 3B:
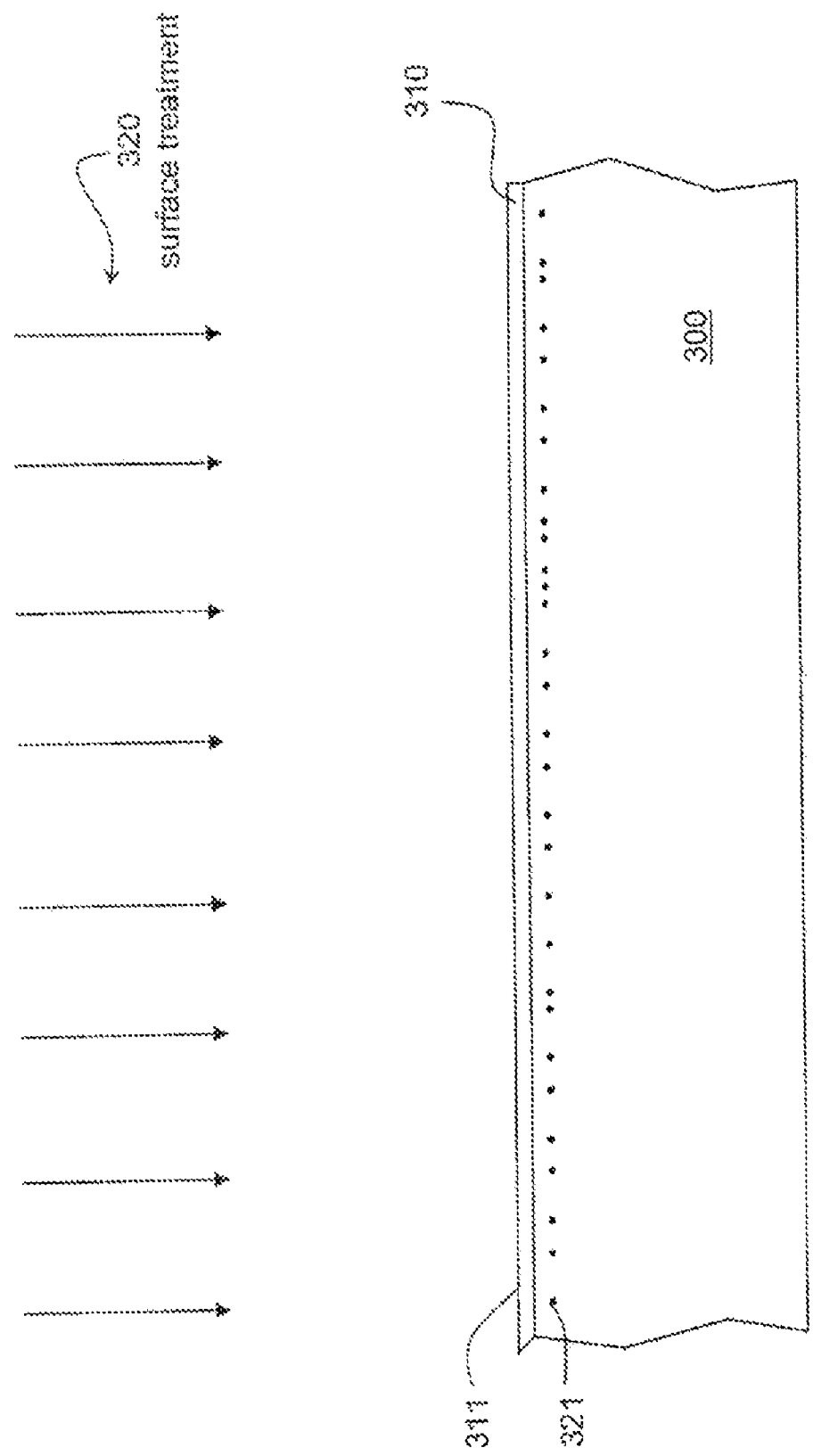

Referring to FIG. 3B, a surface treatment 320 is applied to the surface 311 of the dielectric layer 310. The surface treatment 320 may generate a plurality of nitrogen components and/or vacancies 321 in the region at a depth near to the interface between the dielectric layer 310 and the substrate 300. In some embodiments, the surface treatment 320 may be similar to the surface treatment 230 described above in connection with FIG. 2B. In some embodiments, the formation of the dielectric layer 310 and the surface treatment 320 may be performed by, for example, a decoupled plasma nitridation (DPN) process.

Figure 3C:
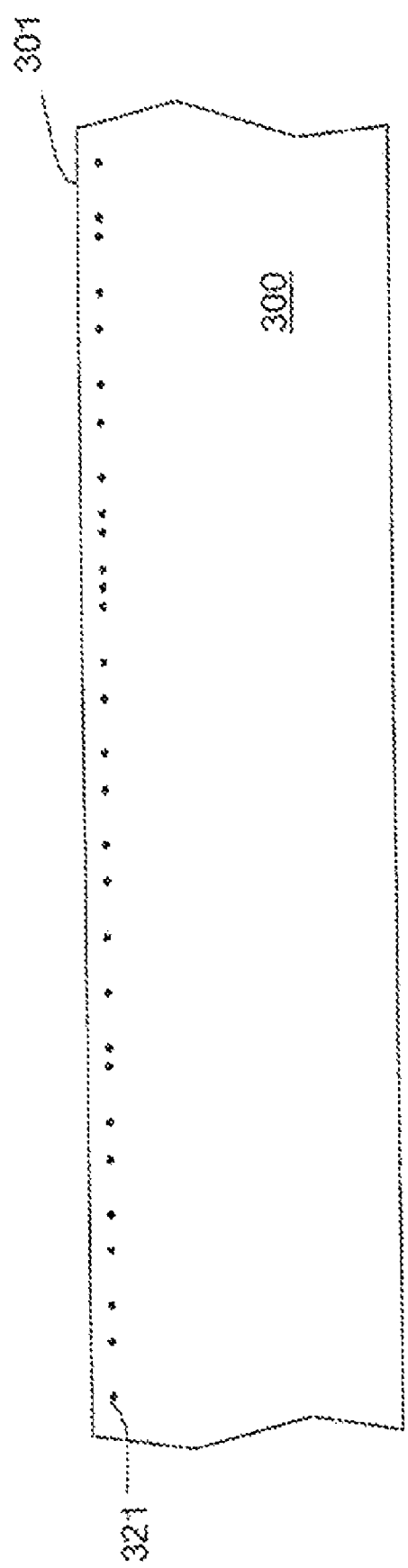

Referring to FIG. 3C, the dielectric layer 310 is removed so as to substantially expose the surface 301 of the substrate 303. The removing process may comprise, for example, a dry etch process, a wet etch process, or other semiconductor removing process or the combination thereof. After the removing the dielectric layer 310, the vacancies 321 will be at the region near to the surface 301 of the substrate 300.

Referring to FIG. 3D, a thermal treatment 323 is applied to the surface 301 of the substrate 300 so as to generate a plurality of vacancies 325 at the region near to the surface 301 of the substrate 300. The thermal treatment 323 may be conducted in a nitrogen-containing ambient. In some embodiments, the thermal treatment 323 may be similar to the thermal treatment 240 shown in FIG. 2C. Since the thermal treatment 323 may generate more vacancies at the region near to the surface 301 of the substrate 300, the vacancies 325 may outnumber the vacancies 321 (shown in FIG. 3C).

Figure 3E:
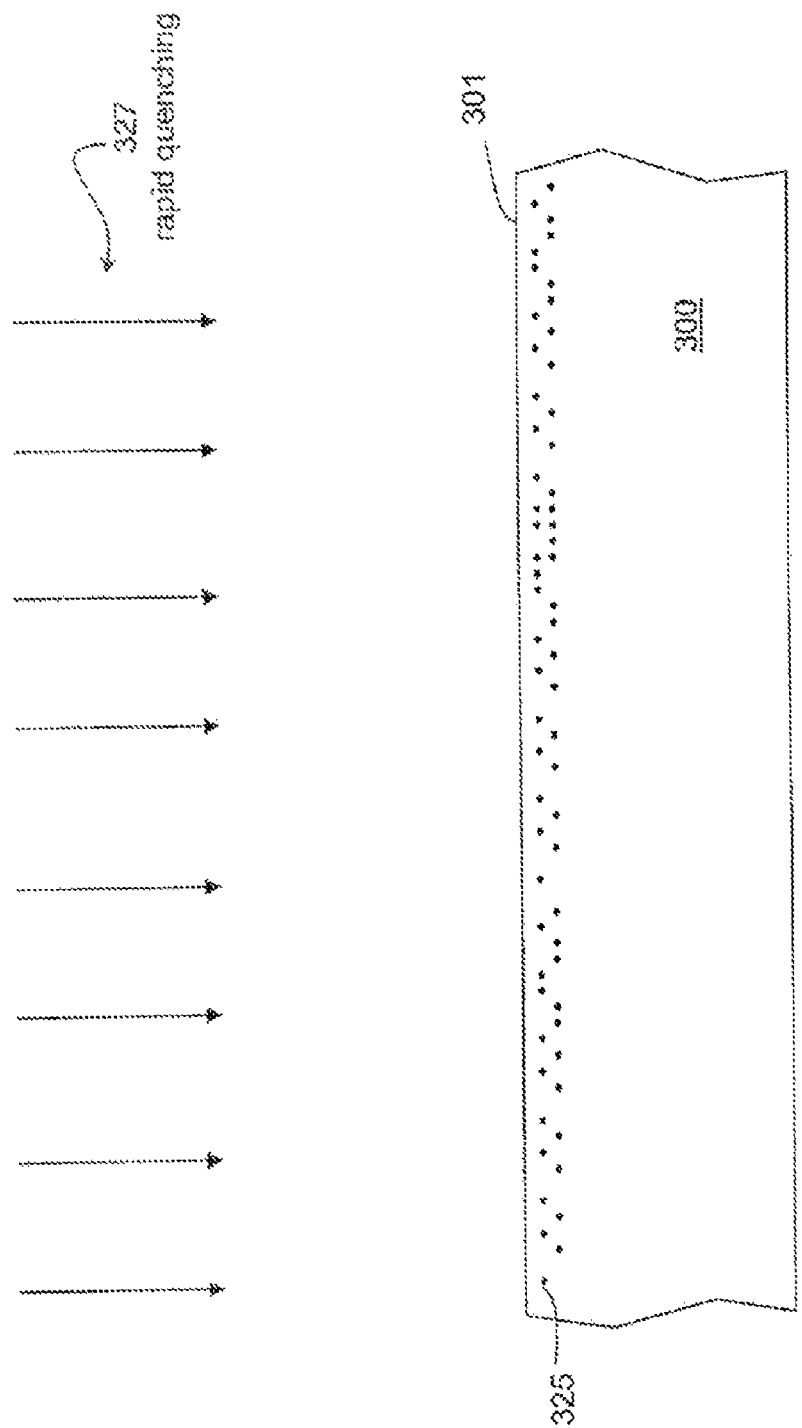

Referring to FIG. 3E, a rapid quenching process 327 is applied to the surface 301 of the substrate 300 such that the distribution profile of the vacancies 325 may be substantially maintained the same as immediately after the thermal treatment 323 (shown in FIG. 3D). In some embodiments, the rapid quenching process 327 may be similar to the rapid quenching process 243 shown in FIG. 2D.

Figure 3F:
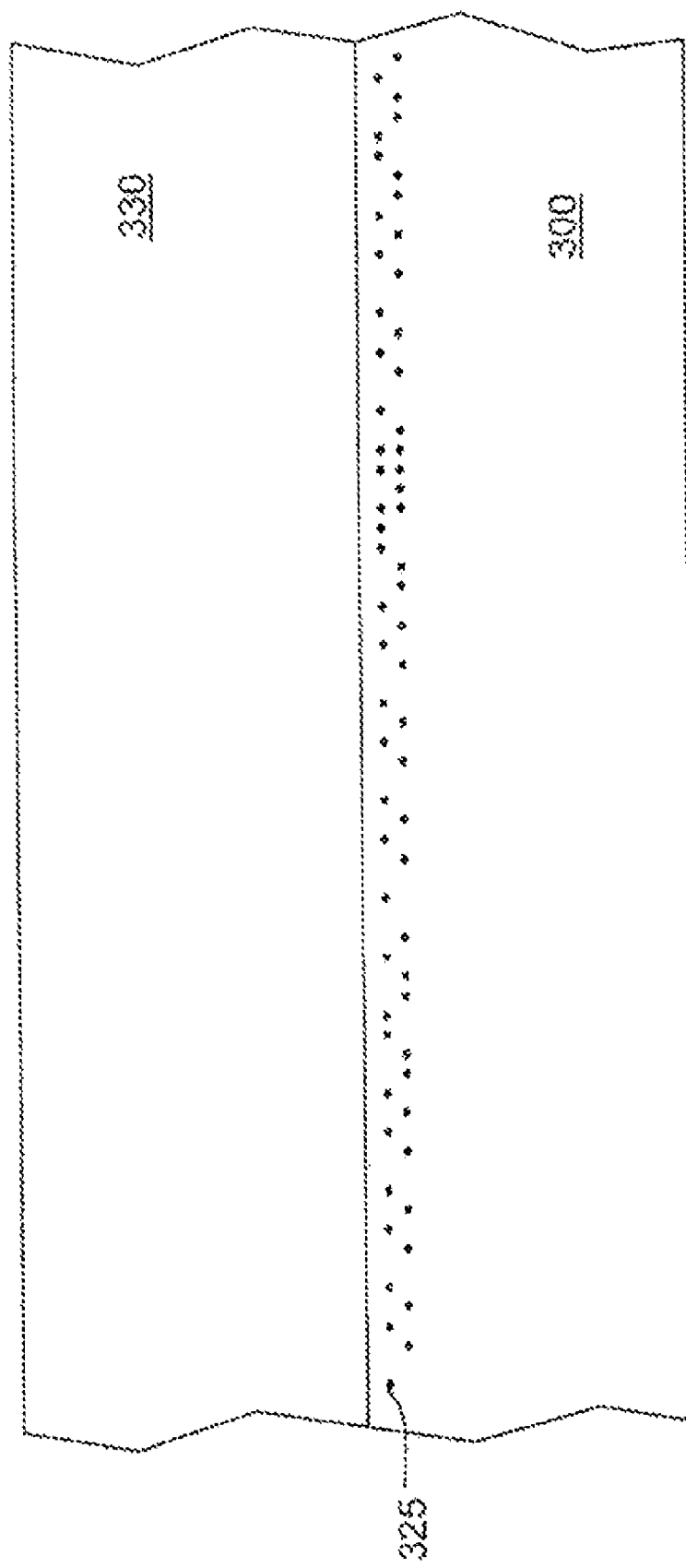

Referring to FIG. 3F, another substrate 330 is bonded over the substrate 300. The substrate 300 is a blank substrate. In some embodiments, the substrate 330 may be similar to the substrate 200 shown in FIG. 2A. The substrate 330 may be bonded over the substrate 300 by, for example, a silicon-to-silicon bonding process.

Figure 3G:
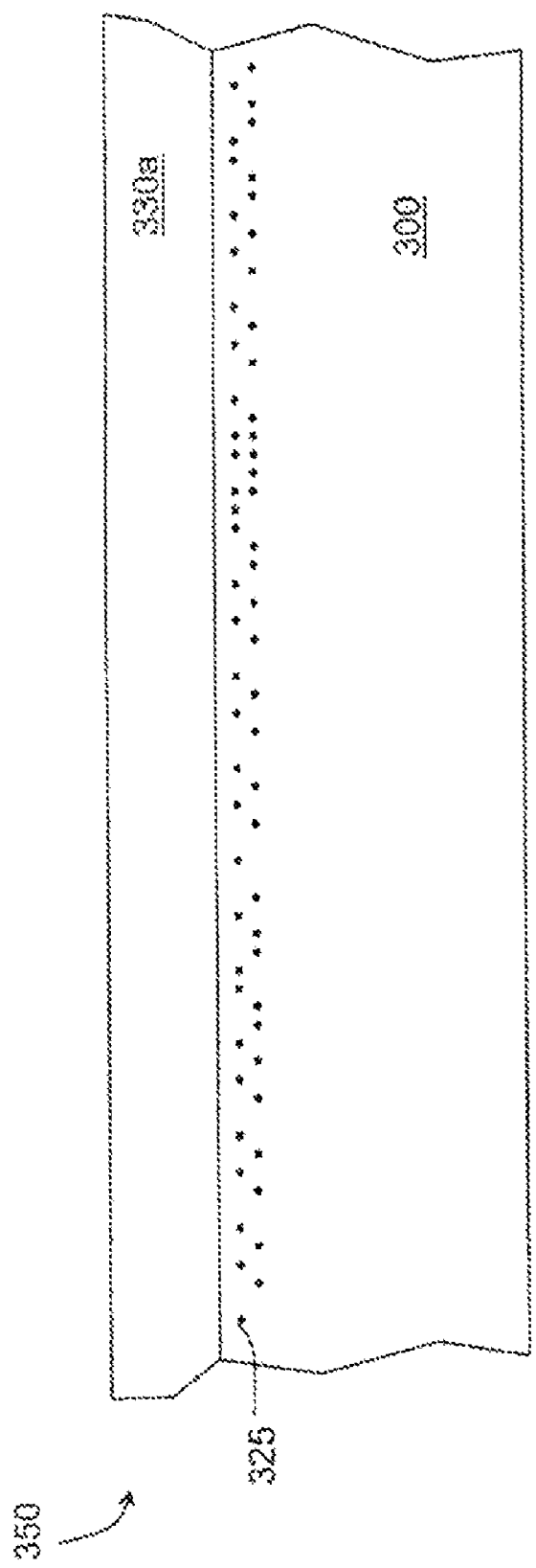

Referring to FIG. 3G, the substrate 330 is men subjected to a polishing process such as a chemical mechanical polishing (CMP) process so as to form the epi-substrate 350 including the substrate 300 and the polished substrate 330a. The polished substrate 330a is provided as a base within or upon which at least one diode, transistor, resistor, device, circuit, other semiconductor structure or combinations thereof is to be formed. The vacancies 325 near to the interface of the substrates 300 and 330a are adequate to trap or catch interstitials during processes such as ion implantation, etch process or the like for forming at least one diode, transistor, resistor, device, circuit or other semiconductor structure (not shown) within or over the polished substrate 330a.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A semiconductor method, comprising:
   forming a gate dielectric layer and a gate conductor over a substrate;
   after forming the gate dielectric layer and the gate conductor, thermally treating at least a portion of a substrate at a process temperature between about 1,000° C. and about 1,350° C. so as to generate a plurality of vacancies in a region at a depth substantially near to a surface of the substrate; and
   quenching the substrate so as to substantially maintain the vacancies in the region at the depth substantially near to the surface of the substrate.

2. The semiconductor method of claim 1, wherein the step of thermally treating at least a portion of a substrate is conducted in a nitrogen-containing ambient.

3. The semiconductor method of claim 1, wherein the step of thermally treating at least a portion of a substrate has a process temperature between about 1,000° C. and about 1,250° C.

4. The semiconductor method of claim 1 further comprising surface treating the portion of the substrate before the step of thermally treating at least the portion of the substrate.

5. The semiconductor method of claim 4, wherein the step of surface treating the portion of the substrate comprises applying a nitrogen-containing plasma treatment process or an ion implantation process.

6. The semiconductor method of claim 1, further comprising:
   forming at least one gate over the substrate, wherein the portion of the substrate is adjacent to the gate; and
   forming at least one source/drain (S/D) region at the portion of the semiconductor substrate.

7. The semiconductor method of claim 1, further comprising:
   forming at least one gate over the substrate, wherein the portion of the substrate is adjacent to the gate; and
   forming at least one lightly doped drain (LDD) region at the portion of the substrate.

8. A semiconductor method, comprising:
   forming at least one gate dielectric layer and at least one gate over a substrate so as to expose at least one region of the substrate adjacent to the gate;
   surface treating the region of the substrate;
   after forming the at least one gate dielectric layer and at least one gate, thermally treating the region of the substrate at a process temperature between about 1,000° C. and about 1,350° C. so as to generate a plurality of vacancies in a region at a depth substantially near to a surface of the substrate;
   quenching the region of the substrate so as to substantially maintain the vacancies in the region at the depth substantially near to the surface of the substrate; and forming at least one source/drain (S/D) region in the region of the substrate.

9. The semiconductor method of claim 8, wherein the step of thermally treating the region of the substrate is conducted in a nitrogen-containing ambient.

10. The semiconductor method of claim 8, wherein the step of thermally treating the region of the substrate has a process temperature between about 1,000° C. and about 1,250° C.

11. The semiconductor method of claim 8, wherein the step of rapidly quenching the region of the substrate has a quench rate of about 50° C. per second (° C./sec) or more.

12. The semiconductor method of claim 8, wherein the step of surface treating the region of the substrate comprises a nitrogen-containing plasma treatment process or an ion implantation process.

13. The semiconductor method of claim 12 further comprising forming a dielectric layer over the region of the substrate, wherein the surface treatment step generates the vacancies in a region at a depth near to the interface between the dielectric layer and the substrate.

14. The semiconductor method of claim 8 further comprising forming at least one lightly doped drain (LDD) region in the region of the substrate.

15. A semiconductor method, comprising:
forming a dielectric layer over a first substrate;
surface treating at least a portion of the first substrate so as to impose a plurality of nitrogen components in a region at a depth near to an interface of the dielectric layer and the first substrate;
removing the entire dielectric layer so as to substantially expose a top surface of the first substrate;
thermally treating the exposed surface of the first substrate so as to generate a plurality of vacancies in the region substantially near to the surface of the substrate; and
quenching the first substrate so as to substantially maintain the vacancies in the region substantially at the depth near to the surface of the first substrate.

16. The semiconductor of claim 15 further comprising:
providing a second substrate separate from the substrate;
bonding the second substrate over the surface of the first substrate by silicon-to-silicon bonding; and
removing a portion of the second substrate so as to form an epi-substrate, wherein the vacancies are capable of trapping interstitials during a manufacturing process.

17. The semiconductor method of claim 15, wherein the step of thermally treating the surface of the first substrate is conducted in a nitrogen-containing ambient and has a process temperature between about 1,000° C. and about 1,250° C.

18. The semiconductor method of claim 1, wherein the step of thermally treating the surface of the first substrate is performed at a process temperature between about 1,250° C. and about 1,350° C.

19. The semiconductor method of claim 8, wherein the step of thermally treating the surface of the first substrate is performed at a process temperature between about 1,250° C. and about 1,350° C.

20. The semiconductor method of claim 15, wherein the step of thermally treating the surface of the first substrate is performed at a process temperature between about 1,250° C. and about 1,350° C.

* * * * *